United States Patent [19]

Willard

[11] Patent Number: 4,678,251

[45] Date of Patent: Jul. 7, 1987

[54] MODULAR INSTALLATION SYSTEM FOR DATA CABLE INTERFACING

[75] Inventor: Stephen J. Willard, Granada Hills, Calif.

[73] Assignee: Installation Technology, Inc., Birmingham, Mich.

[21] Appl. No.: 827,945

[22] Filed: Feb. 10, 1986

[51] Int. Cl.⁴ ............................................ H01R 29/00
[52] U.S. Cl. ..................................... 439/61; 379/328; 439/43
[58] Field of Search .......... 339/17 L, 17 LC, 17 LM, 339/17 M, 198 R, 198 S, 198 P, 198 G, 122 R, 18 R, 18 C, 18 B, 18 P; 179/98; 361/416

[56] References Cited

U.S. PATENT DOCUMENTS

| | | | |
|---|---|---|---|
| 2,783,443 | 2/1957 | Jencks | 339/92 M |
| 4,018,997 | 4/1977 | Hoover et al. | 179/98 |
| 4,231,628 | 11/1980 | Hughes et al. | 339/17 LC |
| 4,326,107 | 4/1982 | Perna | 179/98 |

FOREIGN PATENT DOCUMENTS 325632 2/1930 United Kingdom ................ 339/148
1315648 3/1973 United Kingdom ............. 339/18 C

OTHER PUBLICATIONS

IBM Bulletin, Guttridge, vol. 20, No. 6, p. 2162, 11-1977.

Primary Examiner—Neil Abrams
Attorney, Agent, or Firm—Harness, Dickey & Pierce

[57] ABSTRACT

The installation system accommodates modular circuit boards, each board providing several RJ-11-style jacks. The circuit boards are secured to the front panel in a parallel, spaced apart configuration using mounting brackets which have metal shield plates to minimize cross talk and radio interference. Connections between a central computer and peripheral devices are conveniently made by plugging jumper cables into selected jacks. The jacks are arranged in a compact matrix with all entrance cables being provided with solderless connectors and being laid side-by-side and secured to the circuit board with tie straps. A method of interfacing a computer to peripheral devices is also disclosed.

17 Claims, 5 Drawing Figures

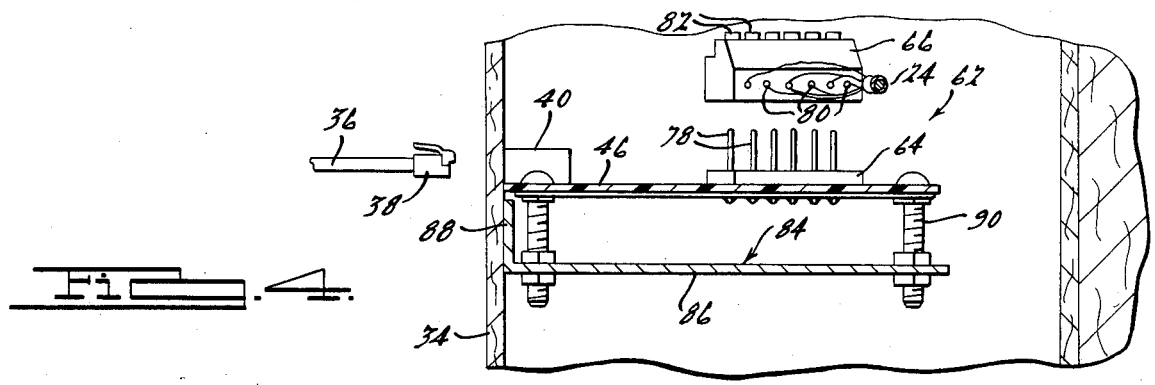
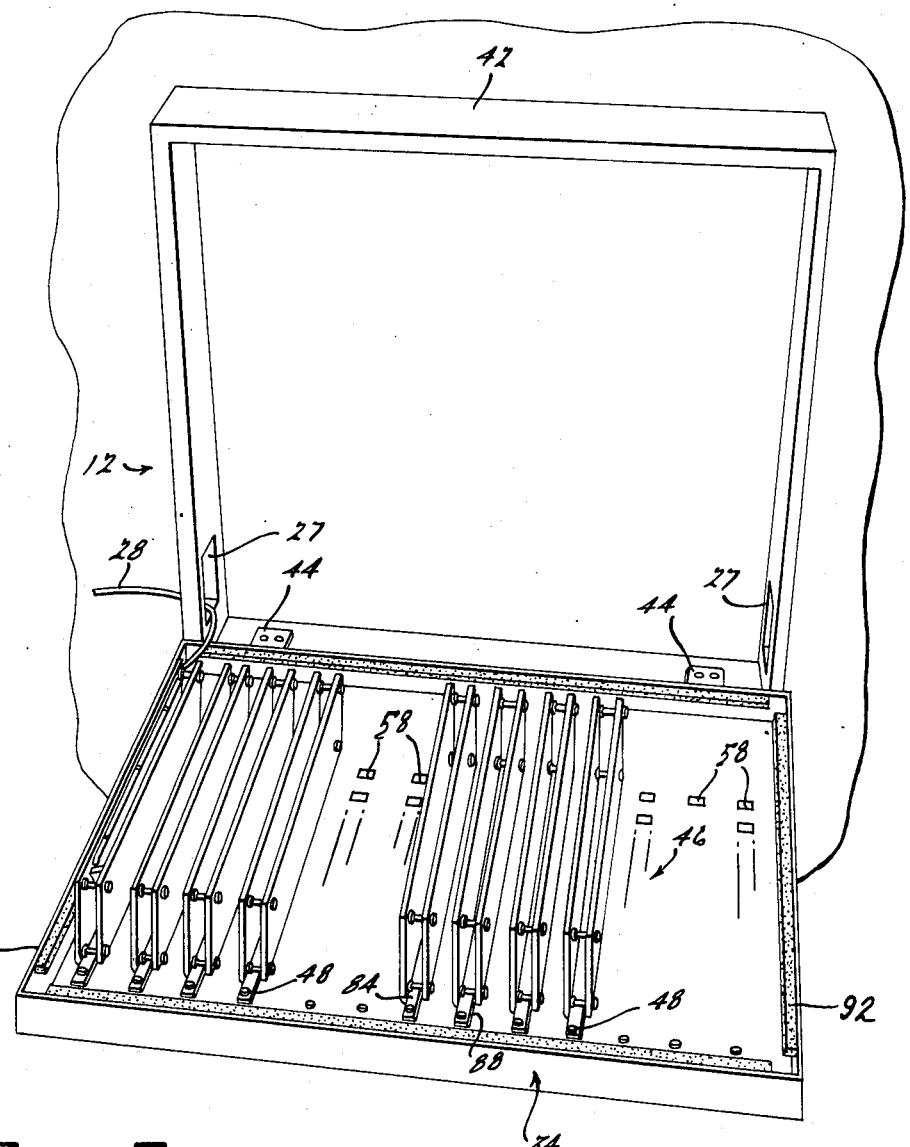

MODULAR INSTALLATION SYSTEM FOR DATA CABLE INTERFACING

BACKGROUND AND SUMMARY OF THE INVENTION

The present invention relates generally to electrical connector assemblies and more particularly to a modular, solderless connector assembly and method for connecting data terminals and peripheral equipment to a central computer. The installation system of the invention allows persons of little computer experience to add, remove or interchange terminals and peripheral devices in the system without disturbing data cables or the connections at the computer input/output ports.

In many offices, business, research and manufacturing applications, it is customary to connect peripheral devices to a central computer through some form of cable network. Such peripheral devices may include data terminals, printers, plotters, modems, bulk data storage devices, optical readers, vision systems and the like. To accommodate a plurality of peripheral devices, many computers are provided with a bank of input/output terminals or ports. Each port is connected to a data channel or group of channels, through which the computer central processing unit (CPU) communicates with the outside world. Many input/output ports are configured as serial ports, although parallel ports are also prevalent.

In permanent and semipermanent installations, the central computer is usually installed in a fixed location, preferably a centralized location, where a favorable physical environment can be maintained. The peripheral devices, on the other hand, are usually located at work stations or points of convenience, often quite remote from the computer itself. Connecting cables, run through duct work in the walls, floor or ceiling or run along baseboards, are used to connect the computer with the peripheral devices. In many instances, these connecting cables may conform to the RS-232 interface standard established by the Electronic Industries Association (EIA). The RS-232 interface uses a standardized 25 pin connector, known in the trade as a DB 25 connector. The DB 25 connector provides two rows of in-line pins which carry pre-established signals according to the standard. Although 25 pins (25 signal paths) are defined by the standard, often fewer than 25 pins are often needed to connect the peripheral device with the computer. For most peripheral devices, 6 pins are usually more than enough.

Where computer systems are involved, change can be counted on. New peripheral devices may be added and old ones may be replaced or relocated, depending on the changing needs of the workers. Also, since peripheral devices are expensive, it is often desirable to share a peripheral among several users. Preferably, this would be done without having to unplug and physically relocate the device, as any unnecessary movement increases the likelihood of damage. As a practical matter, most computers have only a finite number of physical input/output ports to which peripheral devices may be attached. When the number of peripheral devices in the system exceeds the number of input/output ports, some arrangement must be made for switching several devices between a single port. Although port sharing devices are commercially available, most do not provide the desired flexiblity. Many prior art port sharing devices are limited in the number of peripheral devices they will support and cannot be readily expanded.

The present invention overcomes the deficiencies of present day port sharing devices and connectors by providing an installation board which may be configured in a multitude of ways and which provides modular subcomponents to allow for expansion.

The invention provides an installation system comprising one or more modular circuit boards, each having a first plurality of traces and a second plurality of traces. A first jack is electrically coupled to the first plurality of traces and a second jack is electrically coupled to the second plurality of traces. Both jacks are secured to the circuit board, preferably along one edge thereof. The invention further comprises a first connector secured to the circuit board and electrically coupled to the first plurality of traces for coupling to a first entrance cable. A second connector is secured to the circuit board and electrically coupled to the second plurality of traces for coupling to a second entrance cable. The entrance cables may be provided with DB 25 connectors or the like in order to interface with existing computer equipment, peripherals and existing connecting cables. The invention further provides at least one jumper cable having plug connectors at the ends thereof for removably engaging the first and second jacks in order to establish electrical communication between the first and second connectors.

The modular circuit boards are arranged in a space saving stacked fashion within a protective housing. The housing has a front face with a plurality of apertures which register with the jacks associated with each circuit board. Preferably, the jacks are modular jacks, such as RJ-11-style modular jacks or telephone jacks, providing up to six conductors each. The plugs at the ends of each jumper cable are also modular plugs, such as RJ-11-style plugs or the like. The jumper cables may be straight cables or they may be retractable coiled cables.

The individual modular circuit boards are secured to the underside of the front panel, the boards standing off at right angles to the panel and being generally parallel to one another. Each board is removably secured to the panel using a bracket which includes a planar metal panel or plate in spaced parallel relation to the circuit board. The plate helps shield the boards from one another and from electromagnetic interference. The connectors each lie on a line which forms an acute angle with the edge of the circuit board along which the jacks are disposed. The connectors are each disposed a different predetermined average distance from the edge along which the jacks are secured. This arrangement allows a plurality of entrance cables, laid parallel and side-by-side, to fit within the space defined by adjacent circuit board modules and the protective enclosure.

The resulting package is neat and compact, for installation in practically any location. Using the invention, interfacing a computer with peripheral devices (or other computers) is simply a matter of plugging a jumper cable between the appropriate jacks. The jacks may be labeled on the front panel when first installed by a technician. At that time, the correct RS 232 wires are selected from each entrance cable and secured to the circuit board connectors. Once this is done, connecting a peripheral device to a computer input/output port is quickly and conveniently accomplished by even those without computer experience.

The invention also saves time and money in interfacing a computer with remotely located peripheral devices. According to the inventive method, a first group of data cables is installed from a central location in the vicinity of the computer to a plurality of remote locations where it is intended to operate a peripheral device. The data cables can be prewired from the peripheral locations or from receptacles located throughout a building to a single point in the computer room. Any tradesman can do this, keeping installation costs to a minimum. According to the method, a second group of data cables is fabricated, each of the second group being approximately the same length and having a connector at one end adapted to be directly connected to a computer port. Preferably, the number of cables in this second group is equal to the number of computer ports. The second group of cables forms an umbilical cord which is slightly greater in length than the distance between the computer and the central location where the installation system board is to be installed. The connector on each cable in the second group of cables is then connected to a computer port with the opposite ends of the cables being positioned at the central location where the installation system board is to be installed. The installation system board or panel is then installed at the central location. The unconnected ends of each cable in the second group is then connected to a selected one of the plurality of jacks on the installation system board or panel. Further, according to the method, a jumper calbe having a plug at each end is installed between a first jack connected to a specific computer port and a second jack connected to a cable in the first group of cables which extends to the desired remote location. This jumper installing step is then repeated for each of the computer ports to be used.

For a more complete understanding of the invention, its objects and advantages, reference may be had to the following specification and to the accompanying drawings.

BRIEF DESCRIPTION OF THE DRAWINGS

FIG. 4 is another cross-sectional view of the invention taken substantially along the line 4—4 in FIG. 3; and FIG. 5 is a frontal perspective view of the invention with housing open to reveal the modular boards.

DESCRIPTION OF THE PREFERRED EMBODIMENT

Figure 1:
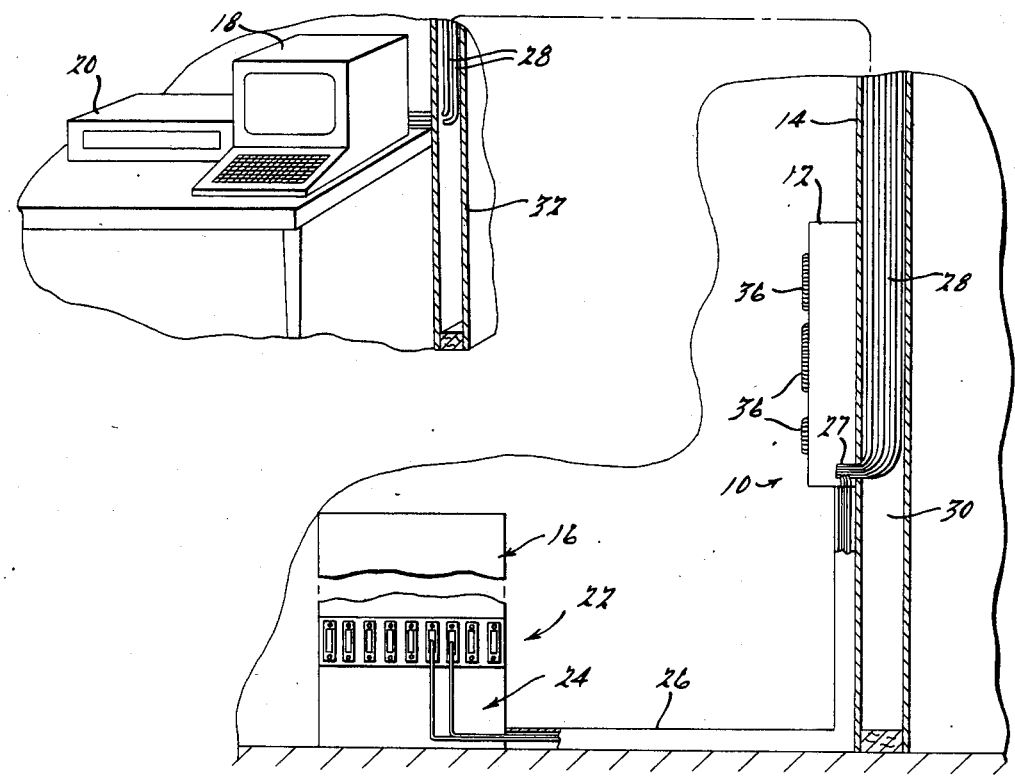
FIG. 1 illustrates the invention in an exemplary application in which the installation system board is wall mounted with entrance cables routed to peripheral devices through the wall and to a central computer through a raceway.

Referring to FIG. 1, the installation system board of the invention is illustrated generally at 10. The board includes a protective housing 12 which may be adapted for securing to a wall, such as wall 14. Although the installation system board 10 may be located anywhere, a typical location would be in the computer room. The invention finds particular utility in connecting peripheral equipment to a computer. Accordingly, FIG. 1 illustrates a computer 16 located in one room and common peripheral devices, data terminal 18 and printer 20, located in another room. Computer 16 is provided with a bank of input/output ports 22. In FIG. 1, two of the input/output ports have data cables or entrance cables 24 coupled to them. Assuming the input/output ports 22 to conform to the RS 232 standard, then entrance cables 24 are connected using DB 25 connectors. Of course, the particular style of connector used will depend on the connector provided by the computer. The invention is not limited to any style of connector. Furthermore, while the RS 232 standard serial port is used by many computers, the invention is not limited to RS 232 serial connections.

In the exemplary application illustrated in FIG. 1, one group or set of data cables or entrance cables 24 is fed through raceway 26 where the group enters through an opening 27 in housing 12. Another group or set of entrance cables 28 is fed through the opening 27 of housing 12 and routed through the duct space 30 within wall 14. From there, entrance cables 28 may be routed to selected locations throughout the building. Two such cables are shown routed thorugh wall 32 and attached to terminal 18 and printer 20.

Figure 2:
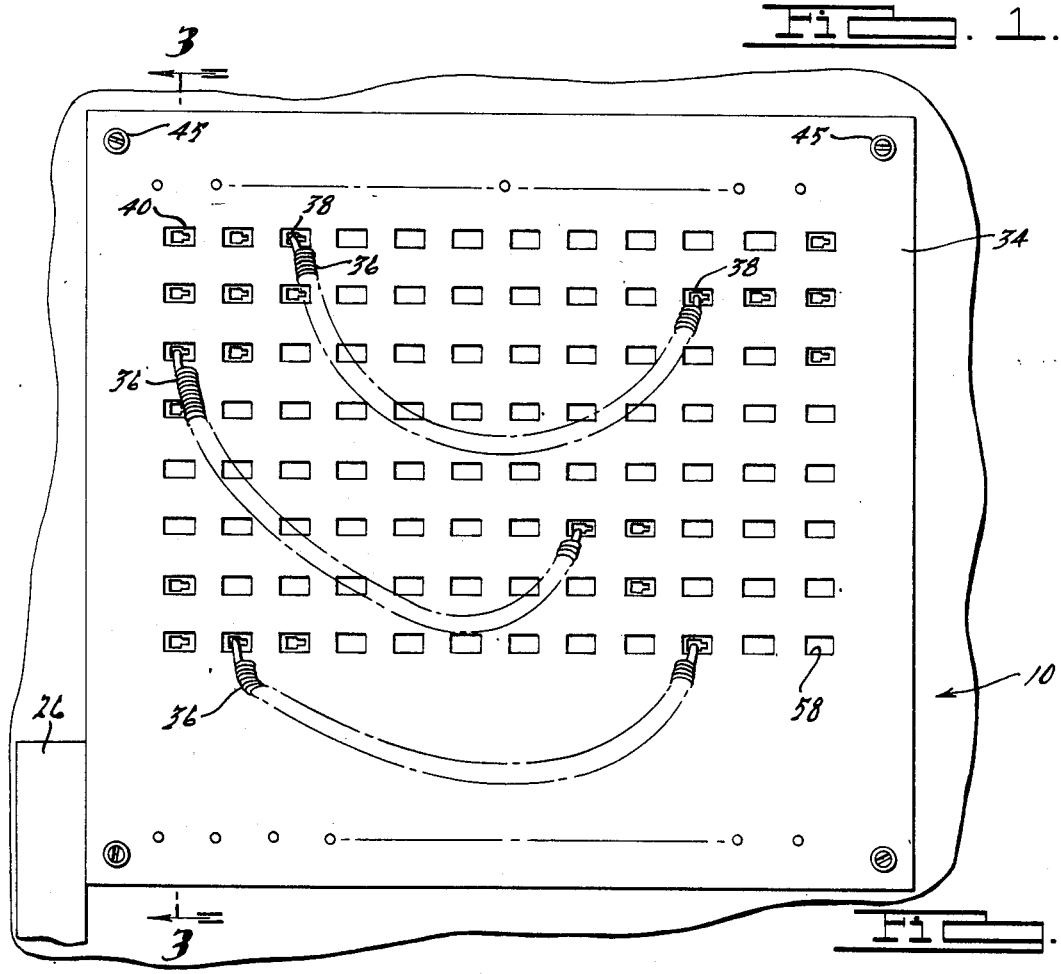
FIG. 2 is a front view of the invention illustrating the front panel of the protective housing.

Referring now to FIG. 2, the front panel 34 of installation board 10 is illustrated. Also illustrated are three coiled jumper cables 36 (shown also in FIG. 1). Jumper cables 36 are provided with miniature plug connectors 38 at each end for plugging into selected jacks 40. Preferably, jacks 40 are arranged in a rectangular matrix or grid. Preferably, jacks 40 and plugs 38 are of the miniature RJ-11-type six conductor variety.

As seen in FIG. 5, front panel 34 is separable from the rear housing portion 42 of housing 12. Preferably, the front panel and rear housing are connected together with hinges 44. Front panel 34 and rear housing 42 may be further secured together in the closed position by means of a latch or with screws, such as screws 45. FIG. 5 illustrates the installation board with front panel face down and rear housing portion 42 swung open to reveal a plurality of modular circuit boards 46 arranged in a spaced apart parallel configuration. Modular circuit boards 46 are secured as with bolts 48 to the underside of front panel 34. As illustrated, circuit boards 46 extend above the side walls 50 of front panel 34, so they are more accessible during initial installation and subsequent circuit tracing.

Figure 3:
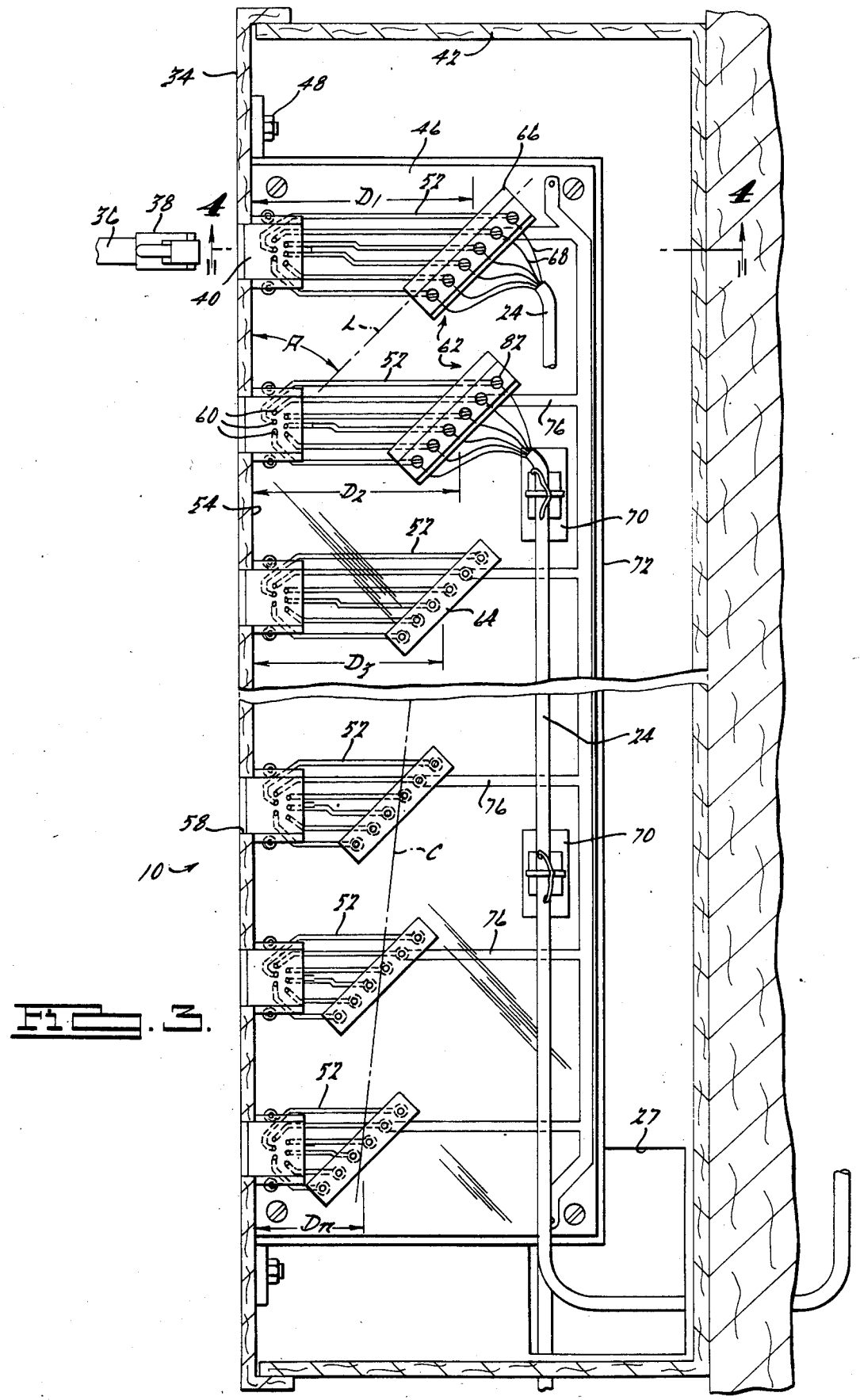
FIG. 3 is a cross-sectional view of the invention taken substantially along the line 3—3 in FIG. 2.

An individual modular circuit board 46 is shown in FIG. 3. The circuit board includes a plurality of generally parallel conductive traces 52 which are arranged in groups of six. FIG. 3 illustrates a modular circuit board 46 having six groups of six traces per group. While the configuration shown in FIG. 3 is presently preferred, the invention may be implemented using circuit boards having greater or fewer groups of traces. Moreover, while six traces per group is normally adequate for most serial communication interfaces, greater or fewer number of traces per group may be used without departing from the spirit of the invention.

Electrically connected to each group of traces is one jack 40. The jacks 40 are arranged along lengthwise edge 54 of circuit board 46, so that all jacks have an outwardly presenting face 56 which lie in a common plane. Preferably, jacks 40 protrude slightly over edge 54 and are in registration with and received by the rectangular apertures 58 through front panel 34. Jacks 40 are held in place by soldering to the traces 52. Jacks 40 have six pins or conductors 60, which are electrically coupled as by soldering to the six traces of each group. Jacks 40 may be implemented using RJ-11-style, modular jacks or telephone jacks. Where more than six traces per group are implemented, larger jacks, such as RJ-45- style jacks may be used. For more information on suitable jacks and plugs, reference may be had to U.S. Pat. No. 4,231,628, issued Nov. 4, 1980, to Hughes et al., entitled "Electrical Connector Receptacles."

At the opposite end of each group of traces 52 a six conductor connector 62 is secured and electrically coupled to the traces as by soldering. Preferably, connectors 62 comprise two mating portions, a lower portion 64 which is actually secured to the traces by soldering and a upper portion 66 which receives the individual wires of entrance cable 24 and which plugs onto the lower portion 64 to establish electrical communication between the individual wires 68 and traces 52. The upper and lower portions of connector 62 are also shown in FIG. 4. Preferably, upper portion 66 has solderless screw terminals or the like to allow the technician to quickly connect selected wires from the entrance cable to connector 62. In this regard, if entrance cable 24 is a full twenty-five wire cable, any combination of up to six wires may be connected to connector 62. The precise connections made will depend upon the requirements of the peripheral device or computer. By temporarily disconnecting upper portion 66 from lower portion 64, the technician can establish, check or alter the connections with relative ease. FIG. 4 illustrates upper and lower portions of connector 62 detached from one another to reveal conductor prongs 78. The wires of an entrance cable are stripped and then inserted into holes 80 in upper portion 66. Screws 82 are then tightened to make electrical contact and to hold the wire in place. If desired, the upper portions 66 of unused connectors may be omitted.

As shown in FIG. 3, connectors 62 are angled relative to the rectangular dimensions of circuit board 46. In other words, connectors 62 each lie on a line L which forms an acute angle A with the lengthwise edge 54 of circuit board 46. In addition, each connector 62 is disposed a different average distance D from edge 54. In FIG. 3, the uppermost connector is disposed an average distance D1 from edge 54, while the next adjacent connector is disposed an average distance D2 from edge 54. Distance D2 is less than distance D1, thereby establishing a staggered relationship between the two connectors. This staggered relationship is continued along the entire circuit board. Hence, the lowermost connector in FIG. 3 is an average distance Dn from edge 54, distance Dn being the shortest of all the distances. If a line is drawn through the longitudinal centers of all connectors 62, the line C is nonparallel relative to edge 54. This nonparallel or staggered relationship of connectors 62 permits a plurality of entrance cables to be arranged side-by-side, thereby making it easier to connect the individual entrance cable wires to the connectors without confusion and without undue strain on the wires.

In order to maintain a neat and orderly arrangement, a plurality of cable tie straps 70 are provided along the inner lengthwise edge 72. Also running along edge 72 is a common bus trace 74. Trace 74 is connected via spur traces 76 to one of the traces 52 of each group. If desired, bus trace 74 may be connected to the computer system ground.

FIGS. 4 and 5 illustrate bracket 84 used in securing modular circuit boards 46 to the underside of front panel 34. Brackets 84 provide a metal shield plate 86 and an elongated foot bar 88 through which mounting bolts 48 are passed. Preferably, foot bar 88 is at right angles to metal shield plate 86, forming an L-shaped cross-section. A modular circuit board 46 is attached to each plate using stand offs or bolts 90. The circuit boards and shield paltes lie parallel to one another so that the shield plate lies at all points equidistant from the circuit board traces. Metal shield plate 86 serves as an electromagnetic shield or barrier which minimizes crosstalk between adjacent circuit boards. In addition, its shielding effect minimizes radio interference, both by blocking or absorbing signals radiated from the circuit board traces and also by blocking or absorbing outside radio transmission and noise which might otherwise induce currents to flow in the traces. If desired, shield plates 86 may be grounded for even better shielding. To protect the electrical connections from dust and dirt, a foam seal 92 is provided around the inside periphery of front panel 34.

In use, the installation system board 10 is mounted on a wall or other fixed structure, preferably by securing rear housing portion 42 to the wall or structure. Screws 45 are then removed or loosened and front panel 34 is swung on hinges 44 to the open position illustrated in FIG. 5. The installation technician would then determine the appropriate number of modular circuit boards 46 for the particular computer system interface. Also at this time, the appropriate entrance cables 28 are fed through opening 27. The entrance cable wire ends are stripped and inserted into selected holes 80 in upper connector portion 66. Screws 82 are then tightened down onto the stripped wire ends, thereby making electrical contact with the wires and holding them in place. Precisely which wires are inserted in which holes will depend upon the particular computer system interface. For example, the technician may select the extreme left hand connection hole 88 for the transmit wire and select the next adjacent connector hole for the receive wire. Once this protocol has been established, all of the connectors should be connected in the same way so they will be plug compatible with one another. Naturally, the identity of the transmit and receive wires will depend upon whether the corresponding entrance cables are connected to a data source or a data sink. This determination is made by the technician during initial installation.

Next, the upper connector portions 66 are plugged onto the lower portions 64, thereby establishing electrical connections between the entrance cable wires and modular jacks 40. At this time, the entrance cables are arranged side-by-side into a bundle or harness and held in place with cable tie straps 70. The modular circuit boards 46 are then secured to the underside of front panel 34 using bolts 48. Circuit boards 46 are arranged so that the modular jacks 40 register with the rectangular apertures 58 of front panel 34. It is usually easier to apply tie straps 70 when the modular boards are unattached from the front panel, although it is possible to apply the tie straps once the modular boards have been secured to the panel. At this point, the front panel may be returned to its closed position and held in place with screws 45. Any changes needed to be made to the internal installation board wiring, such as changing entrance cable wire connections to the connectors or such as adding additional modular circuit boards, are performed essentially as described above.

Preferably, the entrance cables or data cables are arranged into two groups. The first group extends from the central location where the installation system board is installed to a plurality of remote locations where it is intended to operate peripheral devices. The second group of data cables or entrance cables comprises the umbilical cord for attachment to the computer input/output ports 22. Preferably, all of the individual cables of the second group are uniform in length, that length being slightly longer than the distance between the computer and the central location where the installation system board is installed. In FIG. 1, the first group of data cables is illustrated at 28 and the second group of data cables is illustrated at 24. If desired, the installation system board 10 may be furnished with the second group of cables in a standard length, e.g. twenty-five feet, already attached. The first group of cables may be installed between the central location where the installation system board is to be installed and the remote locations by any tradesman. The installing tradesman need not have any specialized computer experience, as the cables may be stripped and connected by the skilled technician after the cable is installed. If desired, the preconnected second group of cables may be equal in number to the number of computer ports available on the computer.

Once the installation system board has been configured and installed by the technician, it is ready to be used by even those of little computer experience. In order to establish a connection between a given computer input/output port and a given peripheral device, the user simply plugs one end of a jumper cable 36 into the jack corresponding to the selected input/output port and plugs the other end of the jumper cable into the jack of the chosen peripheral device. As described above, jumper cables are provided with RJ-11-type plugs which conveniently snap into place without requiring tools. The RJ-11-type jacks are familiar to practically everyone, since these jacks are widely used to connect residential telephones to a wall outlet. Being familiar to most users, these jacks are far less intimidating than the comparatively large DB 25 connectors. Moreover, these jacks are considerably smaller than the DB 25 connectors normally used in the computer industry. The invention thus provides an easy to use, compact installation board which eliminates much of the confusion associated with attaching peripheral devices to a computer system. The installation board is modular, for easy expansion and may be set up to act as a port sharing device.

While the invention has been illustrated and described in its presently preferred embodiment, the invention is capable of modification and change without departing from the spirit of the invention as set forth in the appended claims.

What is claimed is as follows:

1. An installation system for interfacing a plurality of entrance cables comprising:
   a circuit board having a first plurality of traces and a second plurality of traces and having a first edge;
   a first jack secured to said circuit board adjacent said first edge and electrically coupled to said first plurality of traces;
   a second jack secured to said circuit board adjacent said first edge and electrically coupled to said second plurality of traces;
   first connector means secured to said circuit board and electrically coupled to said first plurality of traces for coupling a first one of said entrance cables thereto;
   second connector means secured to said circuit board and electrically coupled to said second plurality of traces for coupling to a second one of said entrance cables;
   a panel having first and second apertures for registration respectively with said first and second jacks;
   a bracket for securing said circuit board to said panel with said first edge most adjacent said panel;
   said bracket having a shield plate means extending in spaced relation to said first and second plurality of traces; and
   jumper cable means having plug connectors at the ends thereof for removably engaging said jacks and for establishing electrical communication between said first and second connectors.

2. The installation system according to claim 1 wherein said first connector means is disposed a predetermined average distance from said first edge, and said second connector means is disposed a second predetermined average distance from said first edge, said first distance being different from said second distance.

3. The installation system according to claim 1 wherein said first and second connectors each lie on a line which forms an acute angle with said first edge.

4. The installation system according to claim 1 wherein said first and second jacks each have an outwardly presenting face lying in a common plane.

5. The installation system according to claim 1 wherein said traces are generally parallel to one another.

6. The installation system according to claim 1 wherein said first jack and said second jack each comprise an RJ-11-type jack and wherein said plug connectors are RJ-11-type connectors.

7. An installation system for interfacing a computer having a plurality of ports to a plurality of remotely located peripheral devices comprising:
   a first group of data cables disposed between said plurality of remotely located peripheral devices and a central location with a building;
   a second group of data calbes, each of approximately the same length and having at one end a connector adapted to be directly connected to said computer port, the other end of each of said second group of cables being disposed at said central location;
   a panel disposed at said central location and having a plurality of apertures therein;
   at least one circuit board having a plurality of jacks secured along a first edge of said circuit board, said circuit board having traces for electrically coupling to said jacks;
   said circuit board being mounted to said panel with said first edge most adjacent said panel and said jacks in registration with said apertures such that said circuit board extends nonparallel to said panel;
   the end of each cable in both of said groups being connected by said traces to one of said jacks;
   at least on jumper cable having a plug at each end for connecting between a first jack connected to a specific computer port and a second jack connected to a cable in said first group which extends to one of said remotely located peripheral devices.

8. The apparatus of claim 7 wherein the number of cables in said second group is equal to the number of computer ports.

9. The apparatus of claim 7 wherein said computer is disposed a first distance from said central location and wherein said second group of cables is slightly greater in length than said first distance.

10. The method of interfacing a computer having a plurality of ports to a plurality of remotely located peripheral devices, comprising the steps of:

(1) installing a first group of data cables from a central location in the vicinity of the computer to a plurality of remote locations where it is intended to operate a peripheral device;

(2) fabricating a second group of data cables each of approximately the same length and having at one end a connector adapted to be directly connected to a computer port;

(3) connecting the connector one each cable in said second group of cables to a computer port and positioning the opposite ends of said second group of cables in said central location;

(4) installing a panel having a plurality of apertures therein at said central location;

(5) connecting the end of each cable in both of said groups of cables disposed at said central location to at least one circuit board having a plurality of jacks secured along a first edge of said circuit board and having a plurality of electrically conductive traces for coupling said cables to said jacks;

(6) attaching said circuit board to said panel with said first edge most adjacent said panel and said jacks in registration with said apertures;

(7) installing a jumper cable having a plug at each end between a first jack connected to a specific computer port and a second jack connected to a cable in said first group which extends to the desired remote location; and (8) repeating step (7) for each of the computer ports to be used.

11. The method fo claim 10 wherein the number of cables in said second group is equal to the number of computer ports.

12. The method of claim 10 wherein the length of said second group of cables is slightly greater than the distance between the computer and said central location.

13. An installation system for interfacing a computer having a plurality of ports to a plurality of remotely located peripheral devices comprising:

a first group of data cables disposed between said plurality of remotely located peripheral devices and a central location within a building;

a second group of data cables, each of approximately the same length and having at one end a connector adapted to be directly connected to said computer port, the other end of each of said second group of cables being disposed at said central location;

a panel disposed at said central location and having a plurality of apertures therein;

at least two circuit boards each having a plurality of jacks secured along a first edge of said circuit board, said circuit boards having traces for electrically coupling to said jacks;

said circuit boards being mounted to said panel with said first edge most adjacent said panel and said jacks in registration with said apertures and said circuit boards being generally parallel to each other and extending in a nonparallel relation to said panel;

the end of each cable in both of said groups being connected by said traces to one of said jacks;

at least on jumper cable having a plug at each end for connecting between a first jack connected to a specific computer port and a second jack connected to a cable in said first group which extends to one of said remotely located peripheral devices.

14. The installation system of claim 13 wherein said circuit boards lie at right angles to said panel.

15. The installation system of claim 13 wherein said jacks each comprise an RJ-11-type jack and wherein said plugs are RJ-11-type connectors.

16. The installation system of claim 13 wherein the number of calbes in said second group is equal to the number of computer ports.

17. The installation system of claim 13 wherein said computer is disposed a first distance from said central location and wherein said second group of cables is slightly greater in length than said first distance.

* * * * *

UNITED STATES PATENT AND TRADEMARK OFFICE
CERTIFICATE OF CORRECTION

PATENT NO. : 4,678,251
DATED : July 7, 1987
INVENTOR(S) : Stephen J. Willard

It is certified that error appears in the above-identified patent and that said Letters Patent is hereby corrected as shown below:

Column 3, line 28, "calbe" should be -- cable --.

Column 4, line 19, "thorugh" should be -- through --.

Column 6, line 2, "paltes" should be -- plates --.

Column 8, line 37, Claim 7, "calbes" should be -- cables --.

Column 8, line 54, Claim 7, "on" should be -- one --.

Column 9, line 32, Claim 11, "fo" should be -- of --.

Column 10, line 23, Claim 13, "on" should be -- one --.

Column 10, line 34, Claim 16, "calbes" should be -- cables --.

Signed and Sealed this

Sixteenth Day of February, 1988

*Attest:*

DONALD J. QUIGG

*Attesting Officer*     *Commissioner of Patents and Trademarks*